US007960897B2

(12) United States Patent
Sakamoto

(10) Patent No.: US 7,960,897 B2
(45) Date of Patent: Jun. 14, 2011

(54) ULTRASONIC MOTOR

(75) Inventor: Tetsuyuki Sakamoto, Hachioji (JP)

(73) Assignee: Olympus Corporation, Tokyo (JP)

( * ) Notice: Subject to any disclaimer, the term of this patent is extended or adjusted under 35 U.S.C. 154(b) by 260 days.

(21) Appl. No.: 12/330,106

(22) Filed: Dec. 8, 2008

(65) Prior Publication Data
US 2009/0167112 A1 Jul. 2, 2009

(30) Foreign Application Priority Data
Dec. 27, 2007 (JP) ................................. 2007-338366

(51) Int. Cl.
H02N 2/08 (2006.01)
(52) U.S. Cl. ......... 310/323.16; 310/323.02; 310/323.09; 310/323.19
(58) Field of Classification Search ............. 310/323.16, 310/323.17, 323.01, 323.02, 323.09
See application file for complete search history.

(56) References Cited

U.S. PATENT DOCUMENTS

| 7,230,366 | B2 * | 6/2007 | Sasaki et al. | ............. 310/323.17 |
| 2005/0253484 | A1 * | 11/2005 | Kishi et al. | ............... 310/323.16 |
| 2005/0258711 | A1 * | 11/2005 | Funakubo | ................. 310/323.16 |
| 2006/0061235 | A1 * | 3/2006 | Funakubo | ................. 310/323.16 |
| 2006/0061241 | A1 * | 3/2006 | Sasaki | ........................... 310/366 |
| 2006/0169746 | A1 * | 8/2006 | Ozaki et al. | ..................... 228/101 |
| 2006/0191086 | A1 * | 8/2006 | Mourad et al. | ................ 15/22.1 |
| 2006/0238072 | A1 * | 10/2006 | Funakubo | ................. 310/323.16 |
| 2008/0192584 | A1 * | 8/2008 | Yamazaki | ..................... 368/168 |

FOREIGN PATENT DOCUMENTS

JP 8-18379 1/1996

* cited by examiner

Primary Examiner — Walter Benson
Assistant Examiner — Bryan P Gordon
(74) Attorney, Agent, or Firm — Scully, Scott, Murphy & Presser, P.C.

(57) ABSTRACT

An ultrasonic motor produces elliptical vibration by inducing longitudinal vibration and flexural vibration at the same time and drives a driven body by obtaining a drive power from the elliptical vibration. The ultrasonic motor includes a piezoelectric device, reinforcing members which are provided at the antinodes of the flexural vibration on the top side of the piezoelectric device, friction contact members which are provided at the antinodes of the flexural vibration on the bottom side of the piezoelectric device so as to transmit the driving force to the driven body, a holding member which is provided on the piezoelectric device and positioned and held by a case, and a pressure member which presses the holding member so that the friction contact members are brought into a pressure contact with the driven body such that the driven body can be driven by friction.

12 Claims, 3 Drawing Sheets

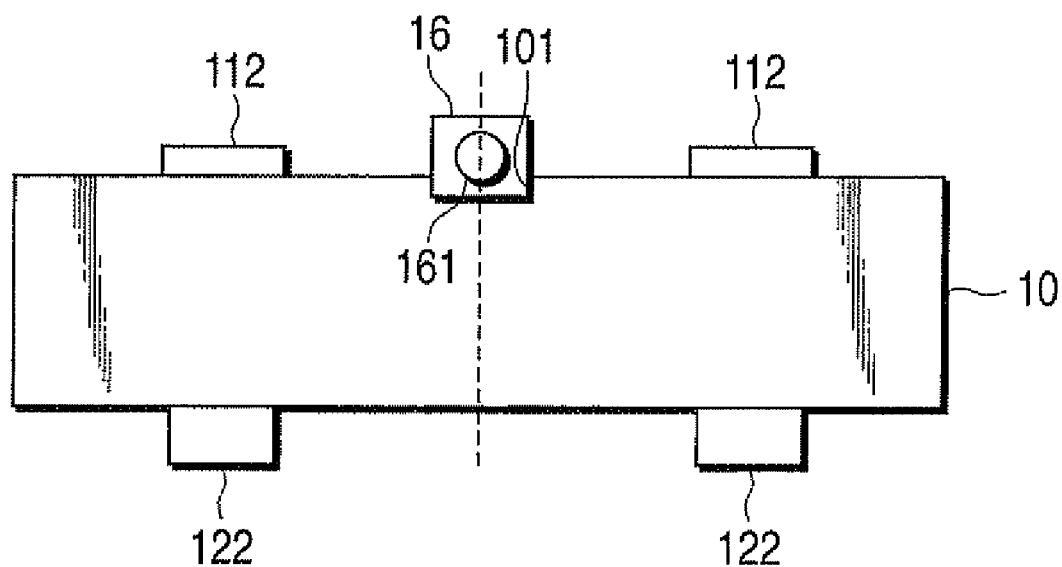
F I G. 7
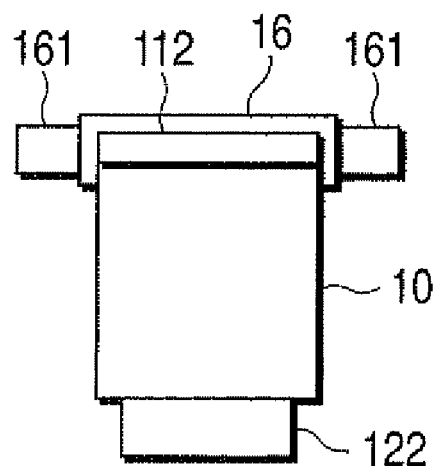
F I G. 8

ULTRASONIC MOTOR

CROSS-REFERENCE TO RELATED APPLICATIONS

This application is based upon and claims the benefit of priority from prior Japanese Patent Application No. 2007-338366, filed Dec. 27, 2007, the entire contents of which are incorporated herein by reference.

BACKGROUND OF THE INVENTION

1. Field of the Invention

The present invention relates to an ultrasonic motor for use as, for example, an image vibration correction unit of a digital camera or an actuator of an AF lens or the like.

2. Description of the Related Art

Generally, when a voltage is applied to a piezoelectric device of the ultrasonic motor, longitudinal vibration and flexural vibration are induced, thereby producing an elliptical vibration (oscillation). The ultrasonic motor transmits this elliptical vibration to a driven body via a driver so as to drive the driven body by friction.

A vibrational component using such a piezoelectric device has been disclosed in, for example, Jpn. Pat. Appln. KOKAI Publication No. 8-18379. According to Jpn. Pat. Appln. KOKAI Publication No. 8-18379, the piezoelectric device is formed as a piezoelectric vibrating body so that the piezoelectric vibrating body is sandwiched such that it can be vibrated by a holding frame. The piezoelectric vibrating body is sandwiched by a pair of cases and sealed such that it can be made to vibrate, thereby being prevented from being damaged by external pressure.

It has been demanded that the motor output of an ultrasonic motor having such a piezoelectric device be raised. To raise the motor output, it is necessary to increase a vibration induced by the piezoelectric device by, for example, increasing electric power applied to the piezoelectric device.

The structure disclosed in Jpn. Pat. Appln. KOKAI Publication No. 8-18379 is capable of preventing the piezoelectric device from being cracked by an external force with the holding frame. However, in such a structure, internal stress is concentrated by the vibration of the piezoelectric device. Thus, this structure cannot prevent the piezoelectric device from being cracked by the concentration of the internal stress. That is, when the motor output is increased so that the vibration of the piezoelectric device is intensified, the vibrational velocity resulting in cracks or destruction is raised, thereby inducing the cracking or destruction of the piezoelectric device due to the concentration of the internal stress, which is a problem inherent in this structure.

BRIEF SUMMARY OF THE INVENTION

The present invention has been achieved in view of the above-described circumstances and an object of the invention is to provide an ultrasonic motor capable of improving a destructive vibrational velocity of a piezoelectric device with a simple structure so as to improve motor output.

The present invention provides an ultrasonic motor, which produces elliptical vibration by inducing longitudinal vibration and flexural vibration at the same time and drives a driven body by obtaining a drive power from the elliptical vibration, comprising: a piezoelectric device, reinforcing members which are provided at the antinodes of the flexural vibration on the top side of the piezoelectric device, friction contact members which are provided at the antinodes of the flexural vibration on the bottom side of the piezoelectric device so as to transmit the driving force to the driven body, a holding member which is provided on the piezoelectric device and positioned and held by a case; and a pressure member which presses the holding member so that the friction contact members are brought into a pressure contact with the driven body such that the driven body is capable of being driven by friction.

With the above-described structure, the stress concentration portion of the flexural vibration on the top side of the piezoelectric device is reinforced by the reinforcing members. Consequently, the resistance to stress is intensified, durability against vibration of the piezoelectric device is improved, prevention of cracking or destruction due to vibration is enhanced, and destructive vibrational velocity is improved, so that the piezoelectric device can execute a highly reliable and highly stable frictional drive. Therefore, the highly reliable and highly stable frictional drive can be achieved and with the simple structure, the destructive vibrational velocity of the piezoelectric device can be improved, thereby raising the motor output.

As described above, the present invention enables to provide the ultrasonic motor capable of improving the destructive vibrational velocity of the piezoelectric device with a simple structure so as to improve the motor output.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 7 is a plane view of the piezoelectric device of an ultrasonic motor according to still anther embodiment of the present invention; and FIG. 8 is a side view of FIG. 7.

DETAILED DESCRIPTION OF THE INVENTION

Hereinafter, the embodiment of the present invention will be described in detail with reference to the accompanying drawings.

Figure 1:
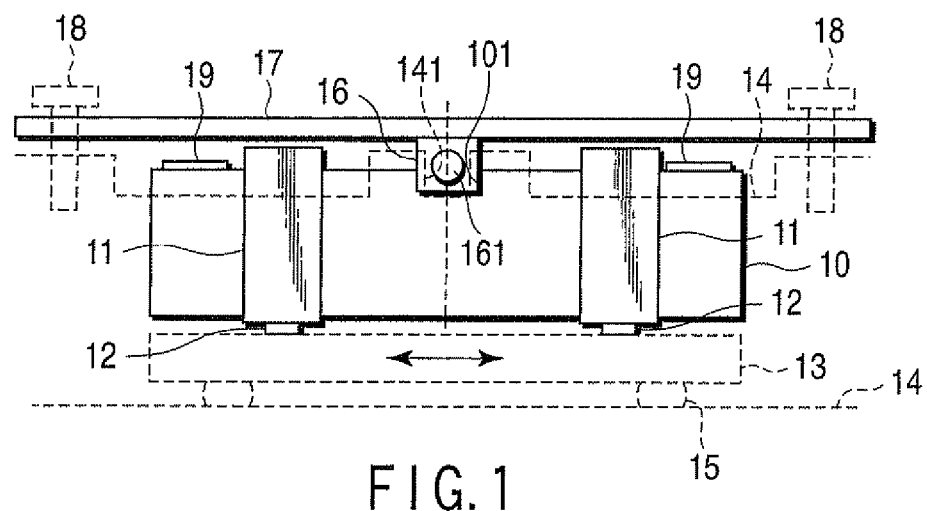
FIG. 1 is a plane view showing the schematic structure of an ultrasonic motor according to an embodiment of the present invention.

First, this embodiment will be described with reference to FIGS. 1 to 4. FIG. 1 is a plane view showing the schematic structure of an ultrasonic motor according to an embodiment of the present invention. A piezoelectric device 10 is composed (constituted) of a plurality of laminated electrode plates, for example. The piezoelectric device 10 (electrode plate) is formed into a rectangular shape. When a voltage is applied to each electrode plate, the longitudinal vibration and flexural vibration of the piezoelectric device 10 are induced corresponding to the voltage thereby producing the elliptical vibration.

In this piezoelectric device 10, substantially square ring shaped reinforcing members 11 are fixed at two positions of the piezoelectric device 10 corresponding to the antinodes (loops) of the flexural vibration of the piezoelectric device 10, for example with adhesive agent. Each reinforcing member 11 is fixed at the two positions of the piezoelectric device 10 such that it surrounds four outer faces of the piezoelectric device 10. That is, the four outer faces of the piezoelectric device 10 on which the reinforcing member 11 is fixed correspond to the antinodes of the flexural vibration of the piezoelectric device 10. The reinforcing member 11 is provided at the antinode of the flexural vibration on the top side of the piezoelectric device 10 since it surrounds four outer faces. The reinforcing members 11 reinforce the surrounding of the antinodes of the flexural vibration at two positions of the piezoelectric device 10. Speaking more in detail, the reinforcing member 11 reinforces the antinode (stress concentration portion) of the flexural vibration on the top side of the piezoelectric device 10 so as to intensify a resistance to stress and improve the durability against the vibration of the piezoelectric device 10. Projecting portions 12 which constitute friction contact members are provided on the bottom side of the reinforcing members 11 corresponding to the antinodes of the flexural vibration on the bottom side of the piezoelectric device 10. The projecting portions 12 are brought into a pressure contact with a driven body 13 by a spring member 17 described later such that the driven body 13 can be moved by friction. At this time, the projecting portions 12 make contact with the driven body 13 so as to transmit a driving force for driving the driven body 13 to the driven body 13. This driving force is a force produced by elliptical vibration, which is induced by longitudinal vibration and flexural vibration at the same time by the piezoelectric device 10. The driven body 13 is provided such that it can be moved freely in the directions indicated with arrows with respect to a case 14 of the piezoelectric device 10 via a plurality of rolling members 15 such as balls.

The reinforcing members 11 may be fixed to the piezoelectric device 10 by known insert molding to the piezoelectric device 10 without use of any adhesive agent, so that the reinforcing member 11 is provided on the outer faces of the piezoelectric device 10.

A concave portion 101 is formed in the topside face of the piezoelectric device 10 corresponding to nodes of the longitudinal vibration of the piezoelectric device 10 in a direction perpendicular to the length direction of the piezoelectric device 10. A holding member 16 which is positioned and held by a case 14 is fixed to this concave portion 101, for example, with adhesive agent. Positioning holding portions 161 are provided projectingly on both end portions of the holding member 16.

When the positioning holding portions 161 are inserted into a positioning recess portions 141 provided in the case 14, they position and hold the piezoelectric device 10 with respect to the case 14. With this state, a pressure member, for example, the intermediate portion of the spring member 17 makes contact with the top side of the holding member 16. The spring member 17 is provided within the case 14 so as to have a desired amount of flexure. The spring member 17 is installed within the case 14 with screw members 18 on both end portions of the spring member 17. Consequently, the spring member 17 urges (presses) the holding member 16 so as to bring the projecting portions 12 of the reinforcing member 11 fixed to the piezoelectric device 10 into a pressure contact with the driven body 13 such that the driven body 13 can be moved by friction. That is, the projecting portions 12 are brought into a pressure contact with the driven body 13 such that the driven body 13 can be driven by friction.

Figure 2:
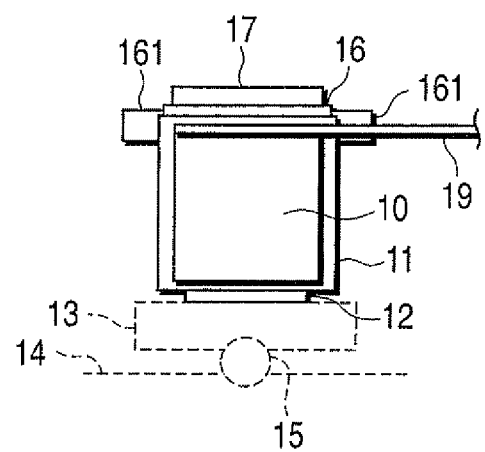
FIG. 2 is a plane view of the ultrasonic motor as seen from its side face in FIG. 1.

As shown in FIGS. 1 and 2, flexible cables 19 are fixed to area A (see FIG. 3) sandwiched by an end portion of the top side of the piezoelectric device 10 and the reinforcing member 11. For example, conductive adhesive agent is used for the flexible cables 19. The piezoelectric device 10 is connected to a driving circuit (not shown) through the flexible cables 19. A voltage is applied to the piezoelectric device 10 through this driving circuit. As a result, as described above, the piezoelectric device 10 induces longitudinal vibration and flexural vibration in correspondence to this voltage so as to produce elliptical vibration. Then, the piezoelectric device 10 obtains a driving force produced by the aforementioned elliptical vibration and transmits this driving force to the driven body 13 through the projecting portions 12.

Figure 3:
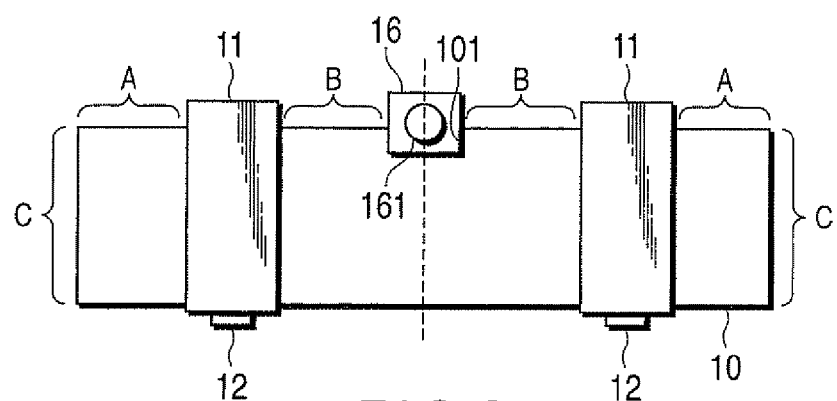
FIG. 3 is a front view of a piezoelectric device of FIG. 1.
Figure 4:
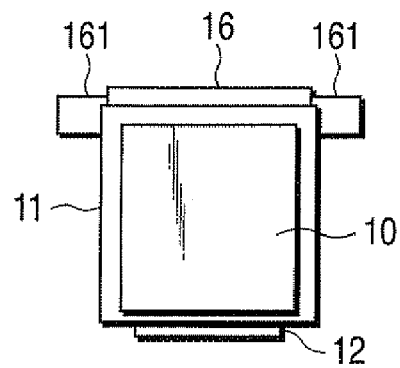
FIG. 4 is a side view of FIG. 3.

Instead of area A, the flexible cables 19 may be fixed to any one of area B sandwiched by the reinforcing member 11 and the holding member 16, area C on both side faces of the piezoelectric device 10 and a combination of areas A, B and C (see FIG. 3). As for the connecting style of the flexible cables 19, the flexible cable may be disposed at a desired position by changing the shape of an electrode inside the piezoelectric device 10.

The reinforcing member 11 is formed of any one of resin material, metal material and ceramics. Speaking in detail, as the metal material, for example, brass having an excellent processability, alloys of beryllium copper, phosphorus bronze and the like having an excellent spring performance, and stainless steel and duralumin having a high stiffness are used. If the reinforcing member 11 is formed of material having a high stiffness such as stainless steel and duralumin, the reinforcing member 11 can be formed thinner and into a smaller size.

As the resin material, for example, epoxy resin, ABS resin, polyphenylene sulfide (PPS) resin, polyether ether ketone (PEEK) resin and the like are used. If the reinforcing member 11 is formed of such resin material, the reinforcing member 11 can be formed into a lighter weight than the metal material and can be injection molded and thus, it is provided (installed) on the piezoelectric device 10 by insert molding. Consequently, by insert molding the reinforcing member 11, the fixing process for the piezoelectric device 10 can be simplified.

As the resin material, reinforced plastic such as liquid crystal polymer (LCP) resin containing filler such as glass fiber and carbon fiber, and PPS resin containing filler such as potassium titanate may be used. If the reinforcing member 11 is formed of such reinforced plastic, the strength, heat resistance and dimensional processing accuracy of the reinforcing member 11 can be improved.

As the ceramics, alumina, zirconia and the like are used. If the reinforcing member 11 is formed of such ceramics, the strength of the reinforcing member 11 can be intensified, so that the reinforcing member 11 can obtain a similar linear expansion coefficient to the piezoelectric device 10. As a result, when the reinforcing member 11 is fixed to the outer surface of the piezoelectric device 10 using thermoplastic adhesive agent, even if the reinforcing member 11 suffers from changes in temperature when the thermoplastic resin is hardened to bond the reinforcing member 11 or changes in temperature of the environment after the thermoplastic resin is hardened, distortion of the adhesive layer is suppressed, thereby achieving a simple and high quality fixing of the reinforcing member 11.

With the above-described structure, when a voltage is applied to the piezoelectric device 10 through a driving circuit (not shown), the piezoelectric device 10 induces the longitudinal vibration and the flexural vibration at the same time so as to produce the elliptical vibration, thereby obtaining a driving force produced by this elliptical vibration. This driving force is transmitted to the driven body 13 through the projecting portions 12 and the driven body 13 is driven by friction in directions of arrows with respect to the case 14 through the rolling members 15. Because the outer face of the piezoelectric device 10 including both the side faces of the piezoelectric device 10 corresponding to the antinode of the flexural vibration which induces concentration of stress by the flexural vibration of the piezoelectric device 10 are reinforced by the reinforcing members 11, the strength of the piezoelectric device 10 is intensified. Consequently, the driven body 13 executes a stable and high quality frictional driving.

Because the outer face corresponding to the antinode of the flexural vibration is reinforced by the reinforcing members 11, the durability against the flexural vibration is intensified, thereby improving destructive vibrational velocity which serves as a standard for formation of cracking or destruction due to concentration of stress accompanied by production of the elliptical vibration in the piezoelectric device 10. As a result, the piezoelectric device 10 can raise its vibrational velocity so as to intensify the motor output, thereby achieving a stable and high quality driving of the driven body 13.

As described above, the ultrasonic motor has the reinforcing members 11 on the outer face containing both the side faces corresponding to the antinode of the flexural vibration which induces concentration of stress by the flexural vibration of the piezoelectric device 10 so as to intensify the strength of the stress concentration portion by the flexural vibration, thereby improving the durability.

Consequently, such a simple structure enables the destructive vibrational velocity, which serves as a standard for formation of cracking or destruction due to concentration of stress accompanied by production of the elliptical vibration of the piezoelectric device 10 to be improved. Thus, the vibrational velocity of the piezoelectric device 10 can be raised and the motor output can be intensified, thereby achieving a stable and high quality driving of the driven body 13.

The present invention is not restricted to the above-described embodiment but may be constructed as shown in FIGS. 5 to 8 while the same effect can be expected. In respective embodiments shown in FIGS. 5 to 8, like reference numerals are attached to the same components as the embodiments shown in FIGS. 1 to 4 and detailed description thereof is omitted.

Figure 5:
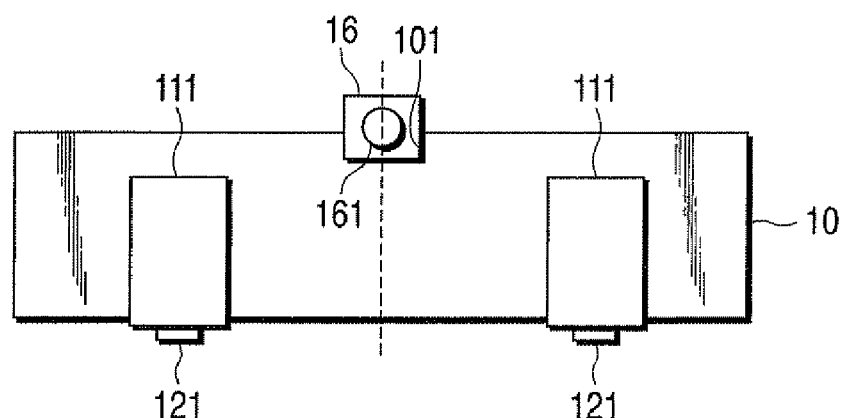
FIG. 5 is a plane view of the piezoelectric device of an ultrasonic motor according to another embodiment of the present invention.
Figure 6:
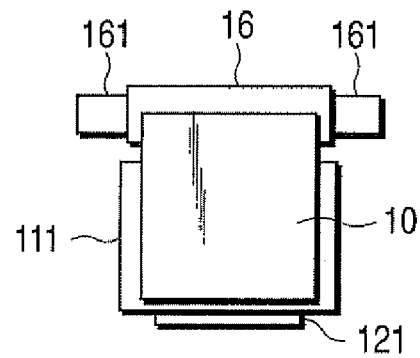
FIG. 6 is a side view of FIG. 5.

According to the embodiment shown in FIGS. 5 and 6, substantially Π shaped reinforcing members 111 which surround the bottom face and both side faces of the piezoelectric device 10 of the outer faces at two positions corresponding to the antinodes of the flexural vibration of the piezoelectric device 10 are fixed, for example, with adhesive agent. This reinforcing member 111 reinforces the antinodes of the flexural vibration of the piezoelectric device 10 with entirely the bottom face side portion and both side face portions of the reinforcing member 111 (inside of the substantially Π shaped reinforcing member 111). Projecting portions 121 which constitute friction contact members are provided projectingly on the bottom face side of the reinforcing member 111 corresponding to the driven body 13. That is, the bottom face side of the reinforcing member 111 functions as friction contact members (projecting portion 121) for transmitting a driving force to the driven body 13.

The projecting portions 121 are brought into a pressure contact with the driven body 13 such that the driven body 13 can be moved by friction by a spring force of the spring member 17 which makes contact with the holding member 16 fixed on the top side of the piezoelectric device 10 as described above.

The reinforcing member 111 is formed of any one of the resin material, metal material and ceramics as described above. The reinforcing member 111 intensifies the reinforcement performance of the piezoelectric device 10 against concentration of stress when the piezoelectric device 10 is subject to the flexural vibration, thereby preventing formation of cracking and destruction due to production of the elliptical vibration.

According to the embodiment shown in FIGS. 7 and 8, reinforcing members 112 are fixed to two positions on the top side of the piezoelectric device 10 corresponding to the antinodes of the flexural vibration of the piezoelectric device 10, for example, with adhesive agent. The reinforcing members 112 are spaced at a desired interval. Friction contact members 122 are fixed to the bottom face side of the piezoelectric device 10 corresponding to the antinodes of the flexural vibration of the piezoelectric device 10 such that they are opposed to the reinforcing members 112. The friction contact members 122 are spaced at a desired interval.

When the positioning holding portions 161 are inserted into the positioning recess portion 141 and the piezoelectric device 10 is positioned with respect to the case 14, the friction contact members 122 make contact with the driven body 13. With this state, the holding member 16 is urged by the spring member 17 so that the friction contact members 122 are brought into a pressure contact with the driven body 13 such that the driven body 13 can be driven by friction. At this time, if a voltage is applied to the piezoelectric device 10, the piezoelectric device 10 induces the longitudinal vibration and the flexural vibration at the same time, so as to produce the elliptical vibration.

At this time, the piezoelectric device 10 is so constructed that the strength of its stress concentration portion by the flexural vibration is intensified by the reinforcing members 112 on the top side of the piezoelectric device 10, thereby preventing formation of cracking and destruction due to the elliptical vibration effectively. The reinforcing member 112 is formed of, for example, any one of the resin material, metal material and ceramics as described above.

The present invention is not restricted to the above-described embodiments but may be modified in various ways within the scope not departing from the principle of the invention when realizing the invention. Further, the above-described embodiments include aspects of various stages of the invention and other various aspects of the invention can be extracted by combining the disclosed plural components appropriately.

For example, even if some components are eliminated from all the components indicated in the embodiment, if the problem intended to be solved can be solved and the effect intended to be attained is secured, the configuration from which those components are eliminated can be extracted as another aspect of the present invention.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. An ultrasonic motor which produces elliptical vibration by inducing longitudinal vibration and flexural vibration at the same time and drives a driven body by obtaining a drive power from the elliptical vibration, comprising:
    a piezoelectric device;
    reinforcing members which are provided at the antinodes of the flexural vibration on the top side of the piezoelectric device;
    friction contact members which are provided at the antinodes of the flexural vibration on the bottom side of the piezoelectric device so as to transmit the driving force to the driven body;
    a holding member which is provided on the piezoelectric device and positioned and held by a case; and
    a pressure member which presses the holding member so that the friction contact members are brought into a pressure contact with the driven body such that the driven body is capable of being driven by friction;
    wherein each of the reinforcing members is provided at a plurality of antinodes of the piezoelectric device; and
    the plurality of antinodes of the piezoelectric device are provided on a same face.

2. The ultrasonic motor according to claim 1, wherein the reinforcing members are formed of any one of resin material, metal material and ceramics and fixed to the piezoelectric device with adhesive agent.

3. The ultrasonic motor according to claim 2, wherein the reinforcing members are formed of resin material and provided on the piezoelectric device by insert molding.

4. The ultrasonic motor according to claim 1, wherein the reinforcing members are formed of resin material and provided on the piezoelectric device by insert molding.

5. An ultrasonic motor which produces elliptical vibration by inducing longitudinal vibration and flexural vibration at the same time and drives a driven body by obtaining a drive power from the elliptical vibration, comprising:
    a piezoelectric device;
    reinforcing members which are provided on at least three faces including the bottom face of the outer faces which surround the antinodes of the flexural vibration of the piezoelectric device while the bottom face side functions as a driver for transmitting the driving force to the driven body;
    a holding member which is provided on the piezoelectric device and positioned and held by the case; and
    a pressure member which presses the holding member so that the bottom face side of the reinforcing members is brought into a pressure contact with the driven body such that the driven body is capable of being driven by friction;
    wherein each of the reinforcing members is provided at a plurality of antinodes of the piezoelectric device; and
    the plurality of antinodes of the piezoelectric device are provided on a same face.

6. The ultrasonic motor according to claim 5, wherein the reinforcing members have projecting portions on the bottom face side thereof and the projecting portions are brought into a pressure contact with the driven body such that the driven body is capable of being driven by friction.

7. The ultrasonic motor according to claim 6, wherein the reinforcing members are formed of any one of resin material, metal material and ceramics and fixed to the piezoelectric device with adhesive agent.

8. The ultrasonic motor according to claim 7, wherein the reinforcing members are formed of resin material and provided on the piezoelectric device by insert molding.

9. The ultrasonic motor according to claim 6, wherein the reinforcing members are formed of resin material and provided on the piezoelectric device by insert molding.

10. The ultrasonic motor according to claim 5, wherein the reinforcing members are formed of any one of resin material, metal material and ceramics and fixed to the piezoelectric device with adhesive agent.

11. The ultrasonic motor according to claim 10, wherein the reinforcing members are formed of resin material and provided on the piezoelectric device by insert molding.

12. The ultrasonic motor according to claim 5, wherein the reinforcing members are formed of resin material and provided on the piezoelectric device by insert molding.

* * * * *